United States Patent
Shin et al.

(10) Patent No.: US 9,305,912 B2
(45) Date of Patent: Apr. 5, 2016

(54) STACK PACKAGE AND METHOD FOR MANUFACTURING THE SAME

(71) Applicant: SK hynix Inc., Icheon-si Gyeonggi-do (KR)

(72) Inventors: Hee Min Shin, Cheongju-si (KR); Cheol Ho Joh, Seoul (KR); Eun Hye Do, Suwon-si (KR); Ji Eun Kim, Suwon-si (KR); Kyu Won Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/734,214

(22) Filed: Jun. 9, 2015

(65) Prior Publication Data

US 2015/0270252 A1   Sep. 24, 2015

Related U.S. Application Data

(62) Division of application No. 12/981,386, filed on Dec. 29, 2010, now Pat. No. 9,082,634.

(30) Foreign Application Priority Data

Jul. 26, 2010   (KR) .................. 10-2010-0071845

(51) Int. Cl.
*H01L 25/00* (2006.01)
*H01L 25/065* (2006.01)
*H01L 23/31* (2006.01)
*H01L 23/00* (2006.01)
*H01L 21/78* (2006.01)
*H01L 25/11* (2006.01)
*H01L 23/538* (2006.01)

(52) U.S. Cl.
CPC .............. *H01L 25/50* (2013.01); *H01L 21/78* (2013.01); *H01L 23/3121* (2013.01); *H01L 24/18* (2013.01); *H01L 24/19* (2013.01); *H01L 24/97* (2013.01); *H01L 25/0657* (2013.01); *H01L 25/117* (2013.01); *H01L 23/5389* (2013.01); *H01L 2224/04105* (2013.01); *H01L 2224/12105* (2013.01); *H01L 2224/73267* (2013.01); *H01L 2224/97* (2013.01); *H01L 2225/0652* (2013.01); *H01L 2225/06524* (2013.01); *H01L 2225/06548* (2013.01); *H01L 2924/01029* (2013.01); *H01L 2924/12042* (2013.01)

(58) Field of Classification Search
CPC . H01L 25/074; H01L 25/117; H01L 25/0657; H01L 25/50; H01L 21/7806; H01L 21/7812; H01L 23/5389
See application file for complete search history.

(56) References Cited

U.S. PATENT DOCUMENTS

2012/0104590 A1*   5/2012   Do ..................... H01L 25/16
257/690

*Primary Examiner* — Matthew W Such
*Assistant Examiner* — Krista Soderholm
(74) *Attorney, Agent, or Firm* — William Park & Associates Ltd.

(57) ABSTRACT

A stack package includes a cover film, a first package having a first semiconductor chip which is attached to the cover film, a first adhesive member which is formed to seal the first semiconductor chip and a surface of the cover film, and a first circuit pattern which is disposed over the first adhesive member and electrically connected with the first semiconductor chip; a second package disposed over the first package, having a second semiconductor chip which is electrically connected with the first circuit pattern, a second adhesive member which is formed to seal the second semiconductor chip, and a second circuit pattern which is formed over the second adhesive member, and a via formed to pass through the second circuit pattern and the second adhesive member and to be electrically connected with the first circuit pattern and the second circuit pattern.

6 Claims, 10 Drawing Sheets

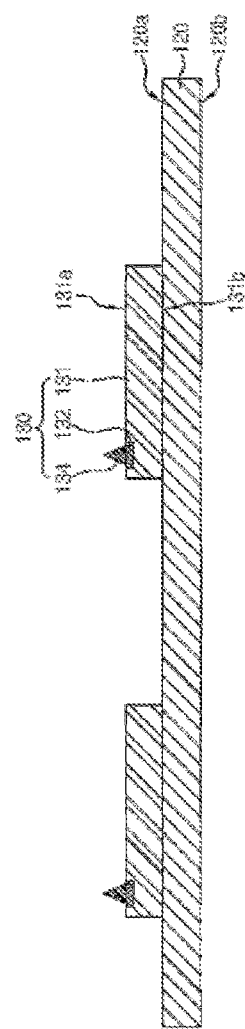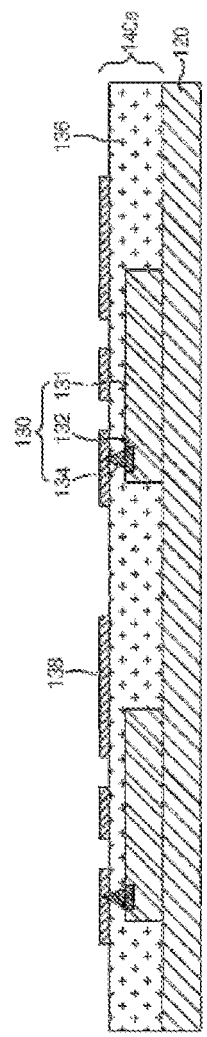

STACK PACKAGE AND METHOD FOR MANUFACTURING THE SAME

CROSS-REFERENCE TO RELATED APPLICATIONS

The present application claims priority to Korean patent application number 10-2010-0071845 filed on Jul. 26, 2010, which is incorporated herein by reference in its entirety.

BACKGROUND OF THE INVENTION

The present invention relates to an embedded type stack package and a method for manufacturing the same.

These days, semiconductor chips capable of storing and processing huge amounts of data within extremely short time periods and semiconductor packages having the semiconductor chips have and are further being developed.

In general, semiconductor packages are manufactured through a die sorting process for inspecting semiconductor chips, a die attaching process for mounting good quality semiconductor chips on printed circuit boards, a wire bonding process for electrically connecting the semiconductor chips with the printed circuit boards using conductive wires, and a molding process for molding the semiconductor chips using a molding member such as epoxy resin.

Recently, while a stack package in which a plurality of package units are stacked is being developed, difficulties may exist in manufacturing a slim stack package due to an increase in a volume occupied by a substrate provided to the package units.

Also, in the case where the substrate and semiconductor chips of the respective package units are electrically connected with each other using conductive wires after the package units are stacked on the substrate to realize a stack package, since lengths of the conductive wires connected to the respective semiconductor chips vary, a speed of the operation of the semiconductor chip may decrease.

BRIEF SUMMARY OF THE INVENTION

Exemplary Embodiments of the present invention are directed to an embedded type stack package and a method for manufacturing the same.

In an exemplary embodiment of the present invention, a stack package includes a cover film, a first package having a first semiconductor chip which is attached to the cover film, a first adhesive member which is formed to seal the first semiconductor chip and a surface of the cover film, and a first circuit pattern which is disposed over the first adhesive member and electrically connected with the first semiconductor chip, a second package disposed over the first package, having a second semiconductor chip which is electrically connected with the first circuit pattern, a second adhesive member which is formed to seal the second semiconductor chip, and a second circuit pattern which is formed over the second adhesive member, and a via formed through the second circuit pattern and the second adhesive member to be electrically connected with the first circuit pattern and the second circuit pattern.

In another exemplary embodiment of the present invention, a method for manufacturing a stack package includes attaching a first semiconductor chip to a cover film, forming a first adhesive member which seals the first semiconductor chip and a surface of the cover film, wherein the first adhesive member has a first circuit metal layer being electrically connected with the first semiconductor chip, forming a first reconfigured wafer level package which includes a first circuit pattern, the first semiconductor chip and the first adhesive member, by patterning the first circuit metal layer, forming a second adhesive member over the first reconfigured wafer level package, attaching a second semiconductor chip to a carrier board which has a second circuit metal layer, adhering the carrier board including the second circuit metal layer and the second semiconductor chip, to the first reconfigured wafer level package including the second adhesive member, turning upside down the carrier board, removing the carrier board from the second semiconductor chip, the second circuit metal layer, and the second adhesive member, forming a second reconfigured wafer level package including a second circuit pattern, the second semiconductor chip and the second adhesive member, by patterning the second circuit metal layer; and forming a via through the second adhesive member and the second circuit patterns to electrically connect the first circuit patterns and the second circuit patterns with each other.

In yet another exemplary embodiment of the present invention, a stack package includes a first semiconductor chip having a first bump, a first adhesive member on which a first circuit pattern is arranged, wherein the first adhesive member arranged on the first semiconductor chip and the first circuit pattern is coupled to the first bump, a second adhesive member arranged on the first circuit pattern, a second semiconductor chip having a second bump, wherein a second circuit pattern is arranged on the second semiconductor chip, and the second bump is coupled to the first circuit pattern, and a via configured to electrically connect the first circuit patterns and the second circuit patterns.

BRIEF DESCRIPTION OF THE DRAWINGS

FIGS. 3A through 3G are cross-sectional views sequentially illustrating the processes of a method for manufacturing a stack package in accordance with another exemplary embodiment of the present invention.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
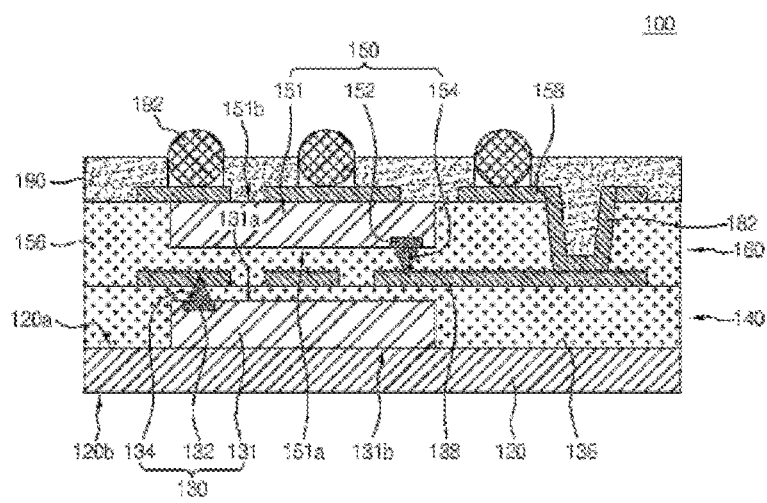
FIG. 1 is a cross-sectional view illustrating a stack package in accordance with an exemplary embodiment of the present invention.

FIG. 1 is a cross-sectional view illustrating a stack package in accordance with an exemplary embodiment of the present invention.

Referring to FIG. 1, a stack package 100 in accordance with an exemplary embodiment of the present invention includes a cover film 120, a first package 140, and a second package 160. The stack package 100 may further include a via 182, a solder mask 190, and an external connection terminal 192.

The cover film 120 has a surface 120a and another surface 120b which faces away from the surface 120a. The cover film 120 may include any one of a black resin film and an adhesive film. Between these films, the black resin film with a good marking property may be used as the cover film 120.

The first package 140 includes a first semiconductor chip 130, a first adhesive member 136, and a first circuit pattern 138.

The first semiconductor chip 130 includes a first semiconductor chip body 131, a first bonding pad 132, and a first bump 134. The first semiconductor chip body 131 may have a plate-like shape. The first semiconductor chip body 131 with the plate-like shape has an upper surface 131a and a lower surface 131b which faces away from the upper surface 131a. The first bonding pad 132 is disposed on the upper surface 131a of the first semiconductor chip body 131. The first bonding pad 132 may be disposed along an edge portion or both edge portions of the first semiconductor chip body 131. Unlike this, the first bonding pad 132 may be disposed along the center portion of the first semiconductor chip body 131. The first bump 134 is disposed on the first bonding pad 132, and may include any one of a metal and a solder.

The first semiconductor chip 130 may further include a first circuit unit (not shown). The first circuit unit may include a data storage section for storing data and a data processing section for processing the data stored in the data storage section. The first bonding pad 132 may be electrically connected with the data storage section and/or the data processing section of the first circuit unit. The first semiconductor chip 130 is attached to the cover film 120 in such a manner that the lower surface 131b of the first semiconductor chip body 131 contacts the surface 120a of the cover film 120. As a consequence, the first bonding pad 132, which is disposed on the upper surface 131a of the first semiconductor chip body 131, is positioned to face away the surface 120a of the cover film 120.

The first adhesive member 136 is formed to seal the first semiconductor chip 130 and the surface 120a of the cover film 120. The first adhesive member 136 may include an epoxy-based resin or an epoxy-based film.

The first circuit pattern 138 is disposed on the first adhesive member 136. The first circuit pattern 138 may include, for example, copper. The first bonding pad 132 of the first semiconductor chip 130 is electrically connected with the first circuit pattern 138 by the medium of the first bump 134.

The second package 160 includes a second semiconductor chip 150, a second adhesive member 156, and a second circuit pattern 158.

The second semiconductor chip 150 includes a second semiconductor chip body 151, a second bonding pad 152, and a second bump 154. The second semiconductor chip body 151 may have a plate-like shape. The second semiconductor chip body 151 with the plate-like shape has an upper surface 151a and a lower surface 151b which faces away from the upper surface 151a. The second bonding pad 152 is disposed on the upper surface 151a of the second semiconductor chip body 151. The second bonding pad 152 may be disposed along an edge portion or both edge portions of the second semiconductor chip body 151. Unlike this, the second bonding pads 152 may be disposed along the center portion of the second semiconductor chip body 151. The second bump 154 is disposed on the second bonding pad 152, and may include any one of a metal and a solder.

The second semiconductor chip 150 may further include a second circuit unit (not shown). The second circuit unit may include a data storage section for storing data and a data processing section for processing the data stored in the data storage section. The second bonding pad 152 may be electrically connected with the data storage section and/or the data processing section of the second circuit unit.

The second semiconductor chip 150 is disposed in a flip type such that the upper surface 151a of the second semiconductor chip body 151 faces the upper surface 131a of the first semiconductor chip body 131. As a consequence, the second bonding pad 152 of the second semiconductor chip 150 is electrically connected with the first circuit pattern 138 by the medium of the second bump 154.

The via 182 is formed to pass through the second adhesive member 156 and the second circuit pattern 158, and electrically connect the first circuit pattern 138 and the second circuit pattern 158.

The solder mask 190 covers the second circuit pattern 158 and the second adhesive member 156 in such a way as to expose portion of the second circuit pattern 158.

The external connection terminal 192 is attached to the exposed portion of the second circuit pattern 158. The external connection terminal 192 may include, for example, a solder ball.

Accordingly, in the stack package in accordance with the exemplary embodiment of the present invention, since semiconductor chips are embedded in adhesive members, it is not necessary to use a printed circuit board, and therefore, the manufacturing costs may decrease. Further, in the stack package in accordance with the exemplary embodiment of the invention, because the semiconductor chips are electrically connected with each other by the medium of circuit patterns and vias, electrical connection paths are shortened, and therefore, a speed of data processing may increase.

Moreover, since a thickness occupied by the printed circuit board may be minimized from the overall thickness of the stack package, a slim stack package may be realized.

Figure 2:
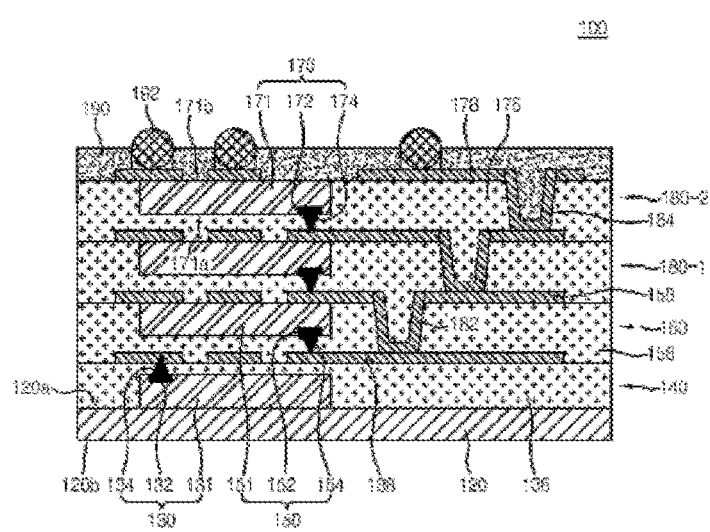
FIG. 2 is a cross-sectional view illustrating a stack package in accordance with another exemplary embodiment of the present invention.

FIG. 2 is a cross-sectional view illustrating a stack package in accordance with another exemplary embodiment of the present invention. Since the stack package in accordance with the exemplary embodiment of the invention may have the same component elements as those of the stack package in accordance with the above-described exemplary embodiment of the invention, repeated descriptions will be omitted herein, and the same reference numerals will be used to refer to the same component elements.

Referring to FIG. 2, a stack package 100 in accordance with another exemplary embodiment of the present invention includes a cover film 120, first and second packages 140 and 160, and a via 182. The stack package 100 may further include a third packages 180-1 and 180-2, a solder mask 190, and an external connection terminal 192.

Since the cover film 120, the first package 140 and the second package 160 may be the same as those of the above-described exemplary embodiment, repeated descriptions thereof will be omitted herein.

One or more third packages 180-1 and 180-2 are stacked over the second package 160. Each of the third packages 180-1 and 180-2 includes a third semiconductor chip 170, a third adhesive member 176, and third circuit patterns 178.

The third semiconductor chip 170 includes a third semiconductor chip body 171, third bonding pads 172, and third bumps 174. The third semiconductor chip body 171 has an upper surface 171a and a lower surface 171b which faces away from the upper surface 171a. The third bonding pads 172 are disposed on the upper surface 171a of the third semiconductor chip body 171. The third bonding pads 172 may be disposed along an edge portion or both edge portions of the third semiconductor chip body 171. Unlike this, the third bonding pads 172 may be disposed along the center portion of the third semiconductor chip body 171. The third bumps 174 are disposed on the third bonding pads 172, and may include any one of a metal and a solder.

The third bonding pads 172 of a third semiconductor chip 170 in the third package 180-1 which is positioned lowermost among entire third packages 180-1 and 180-2, are electrically connected with the second circuit patterns 158 of the second package 160. That is to say, the third bonding pads 172 of the third semiconductor chip 170 in the lowermost third package 180-1 are electrically connected with the second circuit patterns 158 of the second package 160 by the medium of the third bumps 174.

The third bonding pads 172 of the third semiconductor chips 170 in the third package 180-2 excluding the lowermost third third package 180-1 among the entire third packages 180-1 and 180-2 may be respectively flip-chip bonded to the third circuit patterns 178 disposed thereunder. That is to say, the third semiconductor chips 170 in the third packages 180-2 except the lowermost third package 180-1 are electrically connected with the third circuit patterns 178 disposed thereunder by the medium of their third bumps 174.

The stack package 100 may further include additional vias 184. The additional vias 184 are formed to pass through third adhesive members 176 and third circuit patterns 178 of the third packages 180-1 and 180-2, and electrically connect the second circuit pattern 158 and the third circuit patterns 178 with each other or the second circuit patterns 158 and the third circuit patterns 178 with each other and the third circuit patterns 178 with one another.

Unlike this, while not shown in a drawing, the additional vias 184 may be formed in an integral type in such a way as to pass through the third adhesive members 176 and the third circuit patterns 178 of the third packages 180-1 and 180-2 at the same positions.

The solder mask 190 covers the third circuit patterns 178 and the third adhesive member 176 of an uppermost third package 180-2 among the entire third packages 180-1 and 180-2 in such a way as to expose portions of the third circuit patterns 178 of the uppermost third package 180-2.

The external connection terminals 192 are attached to the exposed portions of the third circuit patterns 178 of the uppermost third package 180-2. The external connection terminals 192 may include, for example, solder balls.

Accordingly, in the exemplary embodiment of the invention, a stack package with a higher capacity compared to the above-described exemplary embodiment may be realized by additionally stacking one or more third packages over the second package.

FIGS. 3A through 3G are cross-sectional views sequentially illustrating the processes of a method for manufacturing a stack package in accordance with another exemplary embodiment of the present invention.

Referring to FIG. 3A, first semiconductor chips 130 are attached to a cover film 120 side by side. The cover film 120 has a surface 120a and another surface 120b which faces away from the surface 120a. The cover film 120 may include any one of a black resin film and an adhesive film. Between these films, the black resin film with an excellent marking property may be used as the cover film 120.

Each of the first semiconductor chips 130 includes a first semiconductor chip body 131, first bonding pads 132, and first bumps 134. The first semiconductor chip body 131 may have a plate-like shape. The first semiconductor chip body 131 with the plate-like shape has an upper surface 131a and a lower surface 131b which faces away from the upper surface 131a. The first bonding pads 132 are disposed on the upper surface 131a of the first semiconductor chip body 131. The first bonding pads 132 may be disposed along an edge portion or both edge portions of the first semiconductor chip body 131. Unlike this, the first bonding pads 132 may be disposed along the center portion of the first semiconductor chip body 131. The first bumps 134 are disposed on the first bonding pads 132, and may include any one of a metal and a solder.

The first semiconductor chips 130 are attached to the cover film 120 in such a manner that the lower surface 131b of the first semiconductor chip body 131 of each first semiconductor chip 130 contacts the surface 120a of the cover film 120.

Referring to FIG. 3B, a first adhesive member 136 is formed in such a way as to seal the first semiconductor chips 130 and the surface 120a of the cover film 120 and to have a first circuit metal layer (not shown) which is electrically connected with the first semiconductor chips 130. The first adhesive member 136 having the first circuit metal layer is attached to the first semiconductor chips 130 and the cover film 120 by performing a heat pressing process. As a consequence, the first bonding pads 132 of the first semiconductor chips 130 are electrically connected with the first circuit metal layer by the medium of the first bumps 134.

Next, by selectively patterning the first circuit metal layer, first circuit patterns 138 are formed. Through these processes, a first reconfigured wafer level package 140a, which includes the first semiconductor chips 130, the first adhesive member 136 and the first circuit patterns 138, may be formed.

Figure 3C:
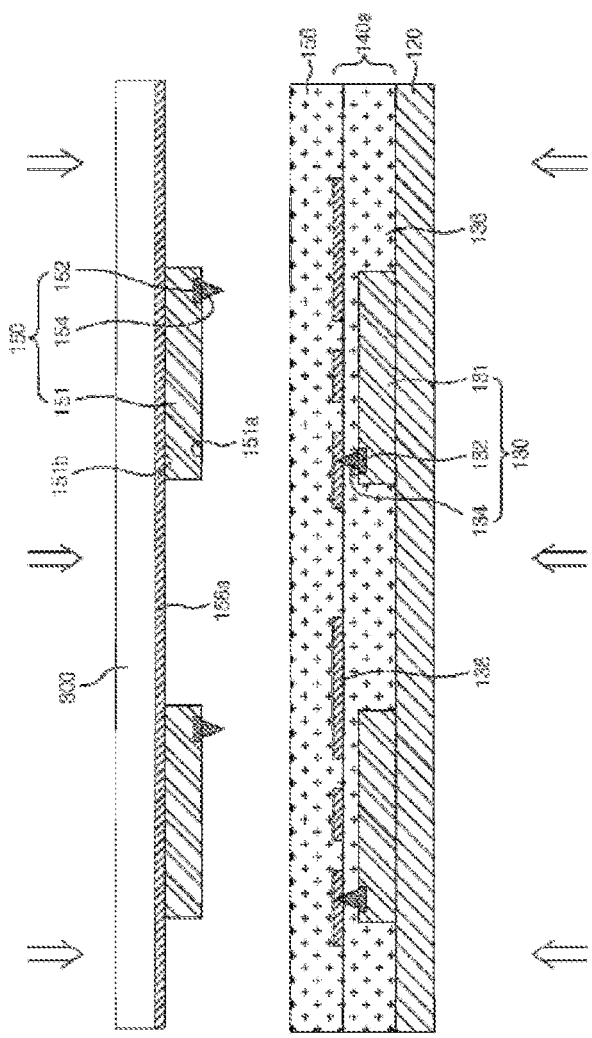

Referring to FIG. 3C, a second adhesive member 156 is formed on the first reconfigured wafer level package 140a. Then, after attaching second semiconductor chips 150 to a carrier board 300 having a second circuit metal layer 158a, the carrier board 300 including the second circuit metal layer 158a and the second semiconductor chips 150 is turned upside down and is arranged over the first reconfigured wafer level package 140a.

Each of the second semiconductor chips 150 includes a second semiconductor chip body 151, second bonding pads 152, and second bumps 154. The second semiconductor chip body 151 may have a plate-like shape. The second semiconductor chip body 151 with the plate-like shape has an upper surface 151a and a lower surface 151b which faces away from the upper surface 151a. The second bonding pads 152 are disposed on the upper surface 151a of the second semiconductor chip body 151. The second bonding pads 152 may be disposed along an edge portion or both edge portions of the second semiconductor chip body 151. Unlike this, the second bonding pads 152 may be disposed along the center portion of the second semiconductor chip body 151. The second bumps 154 are disposed on the second bonding pads 152, and may include any one of a metal and a solder.

Figure 3D:
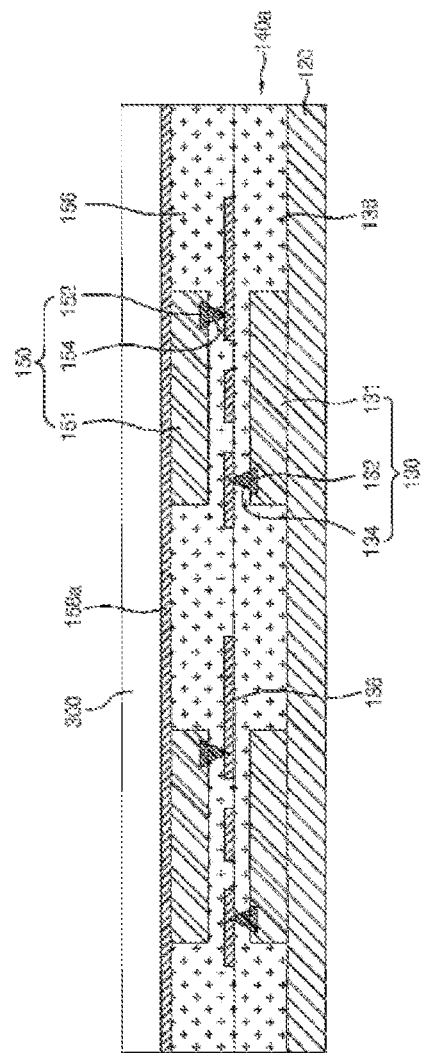

Referring to FIG. 3D, in the state in which the carrier board 300 including the second circuit metal layer 158a and the second semiconductor chips 150 is turned upside down, the carrier board 300 is adhered to the first reconfigured wafer level package 140a including the second adhesive member 156 by performing a heat pressing process. Accordingly, the second bonding pads 152 of the second semiconductor chips 150 attached to the carrier board 300 are disposed in a flip type such that they face the first bonding pads 132 of the first semiconductor chips 130. In this way, the second bonding pads 152 of the second semiconductor chips 150 attached to the carrier board 300 are electrically connected with the first circuit patterns 138 by the medium of the second bumps 154.

Figure 3E:
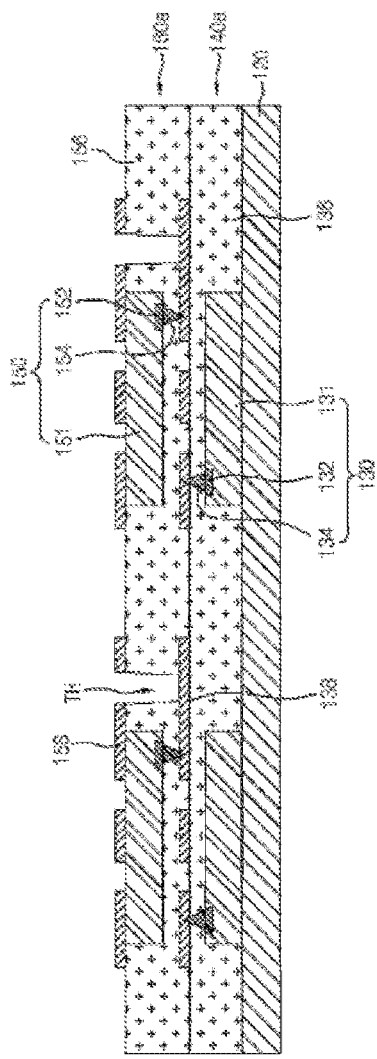

Referring to FIG. 3E, after removing the carrier board 300 from the second semiconductor chips 150, the second circuit metal layer 158a and the second adhesive member 156, second circuit patterns 158 are formed by patterning the second circuit metal layer 158a. Through these processes, a second reconfigured wafer level package 160a, which includes the second circuit patterns 158, the second semiconductor chips 150 and the second adhesive member 156, may be formed.

According to an example, holes TH are formed by performing a laser drilling process or a dry etching process in such a way as to pass through the second adhesive member 156 and the second circuit patterns 158.

Figure 3F:
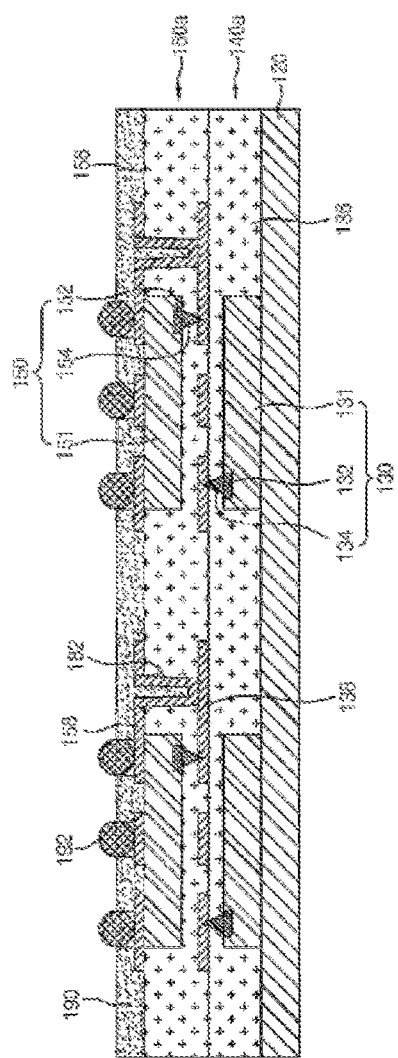

Referring to FIG. 3F, by filling a metallic material in the holes TH, vias 182, which electrically connect the first circuit patterns 138 and the second circuit patterns 158, are formed.

After forming a solder mask 190 which covers the second circuit patterns 158 and the second adhesive member 156 in such a way as to expose portions of the second circuit patterns 158, external connection terminals 192 are attached to the exposed portions of the second circuit patterns 158. The external connection terminals 192 may include, for example, solder balls.

Figure 3G:
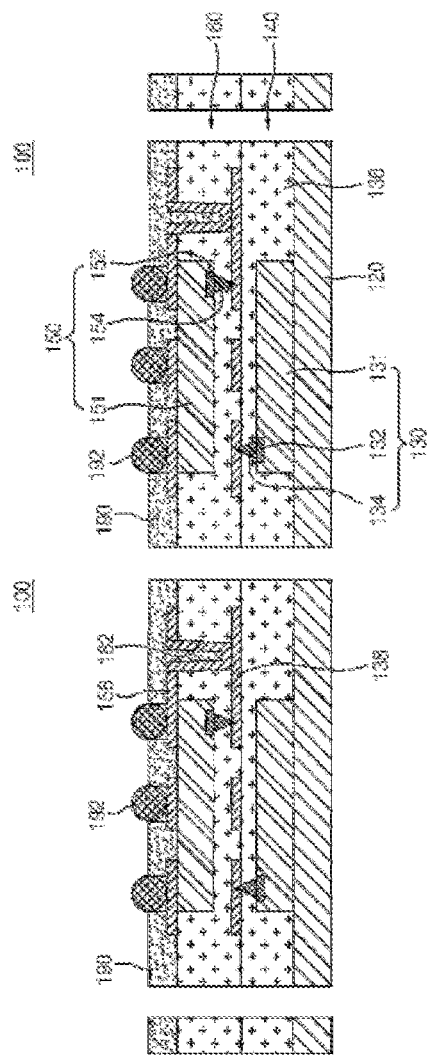

Referring to FIG. 3G, by sawing the first and second reconfigured wafer level packages 140a and 160a and the cover film 120 to a package level, the stack package in accordance with the exemplary embodiment of the invention is manufactured.

Figure 4A:
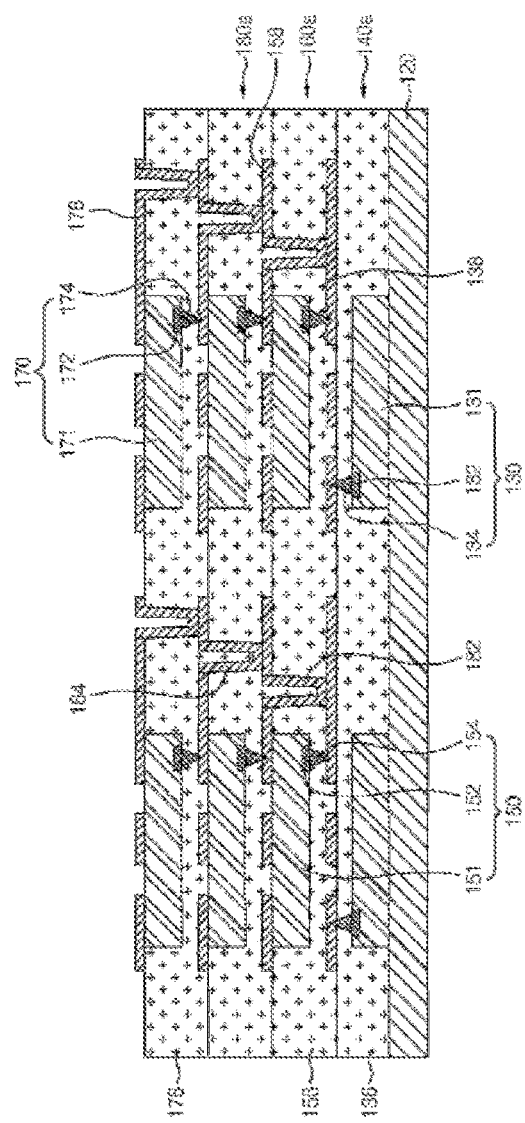
FIGS. 4A and 4B are cross-sectional views sequentially illustrating the processes of a method for manufacturing a stack package in accordance with another exemplary embodiment of the present invention.
Figure 4B:
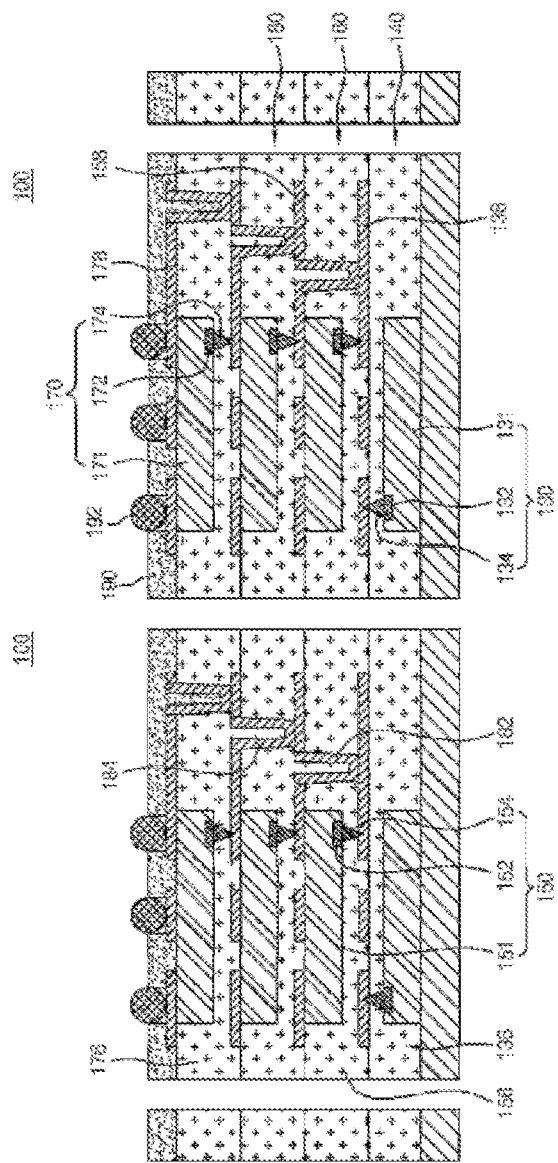

FIGS. 4A and 4B are cross-sectional views sequentially illustrating the processes of a method for manufacturing a stack package in accordance with another exemplary embodiment of the present invention. Since the method for manufacturing a stack package in accordance with the another exemplary embodiment of the invention may have substantially the same process as the method for manufacturing a stack package in accordance with the above-described exemplary embodiment of the invention, repeated descriptions will be omitted herein.

Referring to FIG. 4A, by conducting the same processes as in FIGS. 3A through 3D, first and second reconfigured wafer level packages 140a and 160a are formed over the cover film 120.

After forming holes (not shown) by performing a laser drilling process or a dry etching process to pass through the second adhesive member 156 and the second circuit patterns 158, vias 182, which electrically connect the first circuit patterns 138 and the second circuit patterns 158, are formed by filling a metallic material in the holes.

One or more third reconfigured wafer level packages 180a, each of which has a third semiconductor chip 170, a third adhesive member 176 and third circuit patterns 178, are formed over the second reconfigured wafer level package 160a.

The third reconfigured wafer level package 180a is formed in substantially the same way as the second reconfigured wafer level package 160a. In other words, the third reconfigured wafer level package 180a may be formed in such a manner that, in a state in which an additional carrier board (not shown) including third semiconductor chips 170 and a third circuit metal layer (not shown) is turned upside down, the additional carrier board is adhered to the second reconfigured wafer level package 160a through a heat pressing process and the third circuit metal layer is patterned.

Additional vias 184 are formed through the third adhesive members 176 and the third circuit patterns 178 of respective third reconfigured wafer level packages 180a in such a way as to electrically connect the second circuit patterns 158 and the third circuit patterns 178 with each other or the third circuit patterns 178 with one another.

The additional vias 184 may be individually formed after forming each third reconfigured wafer level package 180a. Unlike this, while not shown in a drawing, the additional vias 184 may be formed at once in an integral type after forming all the third reconfigured wafer level packages 180a, in such a way as to pass through the third circuit patterns 178 and the third adhesive members 176 of the third reconfigured wafer level packages 180a.

Referring to FIG. 4B, after forming a solder mask 190 covering the third circuit patterns 178 and the third adhesive member 176 of an uppermost third reconfigured wafer level package 180a among the entire third reconfigured wafer level packages 180a in such a way as to expose portions of the third circuit patterns 178 of the uppermost third reconfigured wafer level package 180a, external connection terminals 192 are attached to the exposed portions of the third circuit patterns 178 of the uppermost third reconfigured wafer level package 180a.

By sawing the first, second and third reconfigured wafer level packages 140a, 160a and 180a and the cover film 120 to a package level, a plurality of stack packages 100 are individualized, and through this, the stack package in accordance with the exemplary embodiment of the invention is manufactured.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:
1. A method for manufacturing a stack package, comprising:
   attaching first semiconductor chips to a cover film;
   forming a first adhesive member which seals the first semiconductor chips and a surface of the cover film, wherein the first adhesive member has a first circuit metal layer being electrically connected with the first semiconductor chip;
   forming a first reconfigured wafer level package which includes a first circuit pattern, the first semiconductor chips and the first adhesive member, by patterning the first circuit metal layer;
   forming a second adhesive member over the first reconfigured wafer level package;
   attaching second semiconductor chips to a carrier board which has a second circuit metal layer;
   attaching the carrier board including the second circuit metal layer and the second semiconductor chips, to the first reconfigured wafer level package including the second adhesive member, turning upside down the carrier board;
   removing the carrier board from the second semiconductor chips, the second circuit metal layer, and the second adhesive member;
   forming a second reconfigured wafer level package including a second circuit pattern, the second semiconductor chips and the second adhesive member, by patterning the second circuit metal layer; and
   forming a via passing through the second adhesive member and the second circuit patterns and be electrically connected with the first circuit patterns and the second circuit patterns.

2. The method according to claim 1, wherein, in the adhering of the carrier board to the first reconfigured wafer level package, the second semiconductor chips are arranged in a flip type such that the second semiconductor chips face the first semiconductor chips.

3. The method according to claim 1, after the forming of the via, further comprising:
- forming a solder mask which covers the second circuit pattern and the second adhesive member in such a way as to expose a portion of the second circuit pattern;
- attaching an external connection terminal to the exposed portion of the second circuit pattern; and
- sawing the first and second wafer reconfigured level packages and the cover film to a package level.

4. The method according to claim 1, after the act of forming the via, further comprising:
- forming one or more third reconfigured wafer level packages, each of which includes a third semiconductor chips, a third adhesive member and a third circuit pattern, to be stacked over the second reconfigured wafer level package.

5. The method according to claim 4, after the forming of the third reconfigured wafer level packages, further comprising:
- forming an additional via through the third adhesive member and the third circuit pattern of the third reconfigured wafer level package in such a way as to electrically connect the second circuit pattern and the third circuit pattern with each other or the third circuit patterns with one another.

6. The method according to claim 5, after the forming of the additional via, further comprising:
- forming a solder mask which covers the third circuit pattern and the third adhesive member of the third reconfigured wafer level package which is disposed uppermost among entire stacked the third reconfigured wafer level packages in such a way as to expose a portion of the third circuit pattern of the uppermost third reconfigured wafer level package;
- attaching an external connection terminal to the exposed portion of the third circuit pattern of the uppermost third reconfigured wafer level package; and
- sawing the first, second and third reconfigured wafer level packages and the cover film to a package level.

\* \* \* \* \*